United States Patent
Watanabe et al.

[11] Patent Number: 5,998,338
[45] Date of Patent: Dec. 7, 1999

[54] METHOD FOR PREPARING OXIDE SUPERCONDUCTORS

[75] Inventors: Yasuo Watanabe; Akihiko Endo; Takateru Umeda; Yuh Shiohara; Shoji Tanaka, all of Tokyo, Japan

[73] Assignees: Superconductivity Research Laboratory; The University of Tokyo, both of Tokyo, Japan

[21] Appl. No.: 09/047,127

[22] Filed: Mar. 24, 1998

[30] Foreign Application Priority Data

Mar. 24, 1997 [JP] Japan ................................. 9-088791

[51] Int. Cl.[6] .................................................. C04B 35/653
[52] U.S. Cl. .......................................... 505/450; 505/500
[58] Field of Search ............................. 505/450, 451, 505/500, 785

[56] References Cited

U.S. PATENT DOCUMENTS 5,084,436 1/1992 Morimoto et al. ......................... 505/1
5,525,584 6/1996 Murakami et al. ..................... 505/450

FOREIGN PATENT DOCUMENTS

5-279033 10/1993 Japan .
5-279034 10/1993 Japan .

*Primary Examiner*—Mark Kopec
*Attorney, Agent, or Firm*—Flynn, Thiel, Boutell & Tanis, P.C.

[57] ABSTRACT

There is provided a method for stably preparing rare earth (RE) 123 type oxide superconductors exhibiting outstanding superconductive properties in the atmosphere. In the method for preparing RE 123-type oxide superconductors by melting, cooling and solidifying a starting composition containing one or more than two kinds of RE such as Y, Sm, Nd, etc., and Ba, Cu and O as constituent elements to crystallize the RE 123-type oxide superconductors, the quantity of replacement between RE and Ba in "RE 123 crystals to be formed" is controlled by changing the initial constitution of the starting composition, for example, by changing the initial constitution to a more Ba-rich side than a composition on a 123-211 (or 422) tie line on a phase diagram to yield RE 123-type oxide superconductors in the atmosphere, which exhibits a critical temperature of 90 K or above and higher critical current density (Jc) in a magnetic field. A trace amount of Pt or $CeO_3$ may be added to micronize the 211 (or 422) phase so as to further improve Jc.

6 Claims, 5 Drawing Sheets

METHOD FOR PREPARING OXIDE SUPERCONDUCTORS

BACKGROUND OF THE INVENTION

1. Field of the Invention

The present invention relates to a method for preparing rare earth (hereinafter referred to as RE) 123-type oxide superconductors, including Y 123 oxide superconductors, which exhibit a high critical temperature of 90 K or above and have excellent superconductive properties in the atmosphere.

2. Description of the Related Art

Since oxide superconductors exhibiting a critical temperature higher than the temperature of liquid nitrogen (77.3 K) were recently found, superconductor applying technology has been receiving wider appreciation, thereby accelerating the competitive development of materials which exhibit stable superconductivity at higher temperatures.

Especially, in the case of a Y-Ba-Cu-O oxide superconductor as a 123-type oxide in which the mole ratio of Y:Ba:Cu in the material is 1:2:3, a higher critical current density (Jc) has been successfully achieved by improving a process for preparing such a superconductor, while the material has been used as current lead wires as a matter of course and further tried extensively in magnetic applications, etc. by taking advantage of superconductive properties which can generate a large electromagnetic force due to an interaction thereof with a magnetic field.

In addition to the above mentioned Y 123-type oxide superconductor, superior superconductive properties are successively confirmed in other RE 123-type oxides in which Y (yttrium) as a component thereof is replaced by various rare earth elements other than Y and are also widely studied to develop possible devices and instruments by applying these properties.

A "flux process", "melt-solidifying process" and the like are mainly used as a method to prepare RE 123-type oxide superconductors including the Y 123-type (hereinafter Y is included in the expression of rare earth elements or RE).

According to the "flux process" as a method for preparing oxide superconductors, the temperature of a relatively homogeneous supersaturated solution (molten liquid) of a starting composition (flux) comprising an oxide mixture of required components is gradually lowered to crystallize oxide superconductive crystals from the solution cooled below the solubility limit.

On the other hand, according to the "melt-solidifying process", a starting composition (flux) is heated beyond the peritectic temperature of an intended oxide to form a mixed state of solid and liquid phases, the temperature of which is then slowly lowered from the thus heated condition to cause a peritectic reaction so as to form oxide superconductive crystals.

In these processes, the initial constitution of the starting composition is adjusted to reside on a "123-211 (or 422) tie line" of a ternary phase diagram as will be described later (see FIG. 1) while keeping a sufficient but not excessive mass balance to yield a superconductive phase (123 phase) and to cause micro-dispersion of the 211 phase (in cases of Y, Sm, etc.) or the 422 phase (in cases of Nd, La, etc.), which functions as a magnetic flux pinning center in the superconductive phase to increase the critical current density (Jc), or keeping the mass balance to minimize a residue of unreacted Cu, Ba, etc.

It should be understood that the above mentioned "tie line" means a line on the phase diagram which shows a relationship between a crystalline phase composition and a liquid phase composition in the range where crystalline and liquid phases are equilibrated.

It is pointed out, however, that the thus prepared 123-type oxide superconductors, i.e., the RE 123-type other than Y, exhibit neither a sufficient critical temperature (Tc) nor a higher critical current density (Jc) in a magnetic field, although only the Y 123-type has relatively preferable superconductive properties.

As for the reason why, it is considered that the ionic radius of rare earth elements (RE), except Y, is relatively large and comparable to that of Ba, which causes the mutual replacement of RE and Ba when a molten raw material is cooled and solidified to form a superconductive phase, so that the chemical composition of the thus formed oxide crystals deviates from that of the 123 phase to be yielded.

Figure 1:
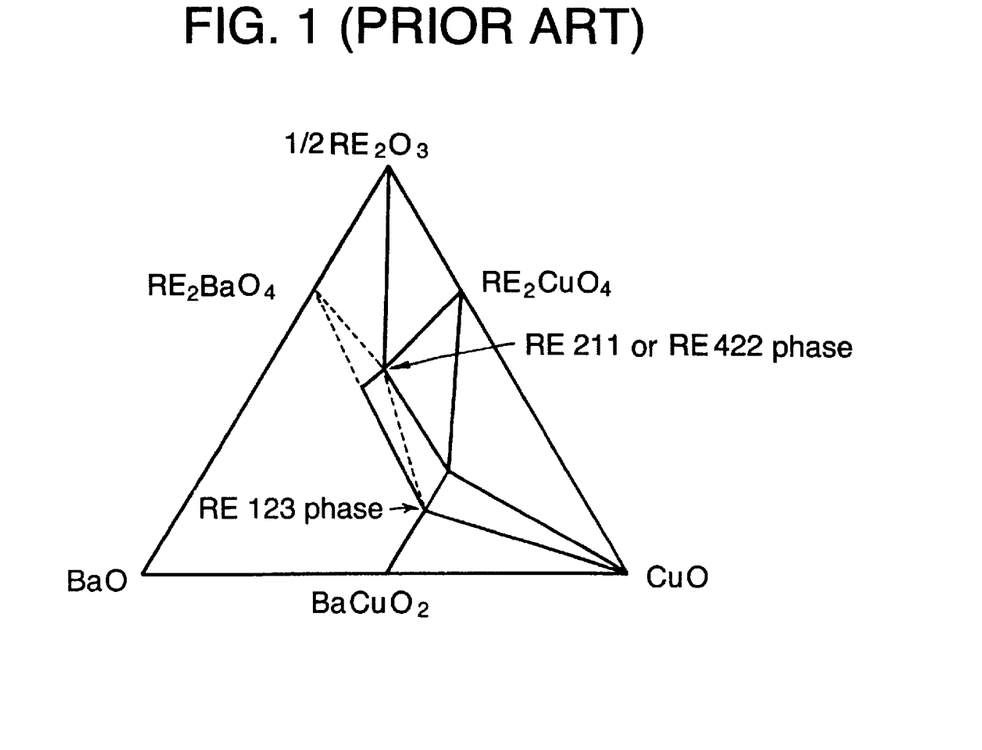
FIG. 1 is a ternary phase diagram of $\frac{1}{2}RE_2O_3$—BaO—CuO.

FIG. 1 shows a "ternary phase diagram of ½$Re_2O_3$—BaO—CuO" in an atmosphere of oxides including RE, such as La, Nd, Sm, Pm, Eu, Gd, etc., having a relatively larger ionic radius. "A solid solution region of certain width" exists along a line extending to the upper right from the RE 123 phase, as shown in FIG. 1. The solid solution region exists to stabilize a phase of $RE1+_xBa_{2-x}Cu_3O_y$, (x>0, 6.0<y<7.2) which deviates from the RE 123 phase in the atmosphere. As is clear from the existence of the solid solution region, the mutual replacement of RE and Ba occurs in oxides of RE having a relatively larger ionic radius when the superconductive phase is solidified in an air atmosphere.

Figure 2:
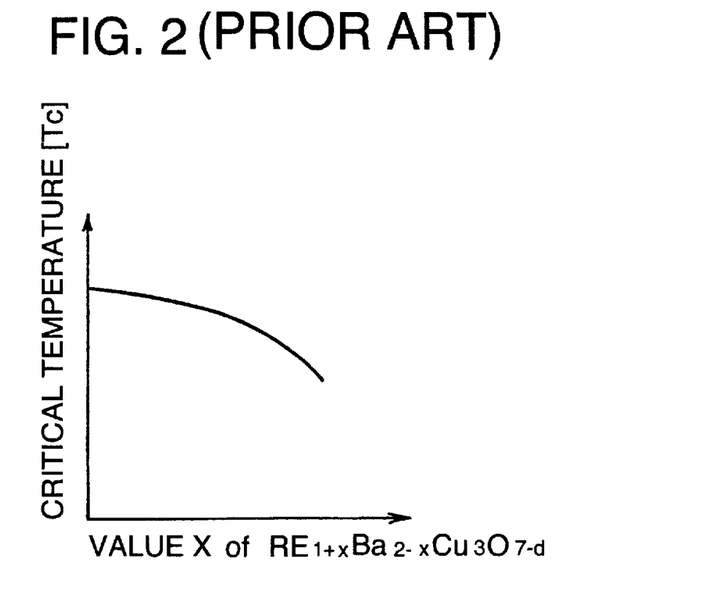
FIG. 2 is a graph showing relationship between a value x of a superconductor $RE_{1+x}Ba_{2-x}Cu_3O_{7-d}$ and critical temperature.

As shown in FIG. 2, the superconductive properties of the RE 123-type oxide superconductors change depending on the quantity of replacement (x) between RE and Ba.

Accordingly, the critical temperature thereof is lowered considerably as the quantity of replacement x increases and, on the other hand, is raised as the quantity of replacement x decreases, i.e., as the composition comes close to that of the RE 123-type oxide.

As is described above, it is considered that the mutual replacement of RE and Ba at a stage to form the superconductive phase by cooling and solidifying the starting material from a molten state thereof (a nucleating and growing stage) is a major cause for hindering the attainment of a higher critical temperature.

Then, there has been proposed an "Oxygen Controlled Melt Growth" process (hereinafter referred to as OCMG process) in which a starting composition is molten and solidified to promote crystal growth not in the ambient atmosphere but in an atmosphere where the content of oxygen in the atmosphere is controlled to a lower level.

It is known that RE 123 type oxide superconductors of Sm, Nd, etc. prepared by the OCMG process exhibit a higher critical temperature (Tc) and a higher critical current density (Jc) in a high magnetic field compared with the Y 123-type oxide superconductor of similar crystal structure because of a phenomenon in which the replacement of RE to a Ba site is controlled in an atmosphere having a low oxygen partial pressure.

In the OCMG process, however, it is quite disadvantageous from a standpoint of production that crystal growth should be performed in a controlled atmosphere of lower oxygen, although RE 123-type oxide superconductors having a higher critical temperature and higher critical current density in a magnetic field can be obtained because RE 123 crystals containing a lower quantity of replaced Ba are easily formed.

On the other hand, in the above described other process in which the starting composition is molten, cooled and solidified to form 123-type oxide superconductive crystals, the initial constitution thereof is adjusted to richen the 211 (or 422)-phase on the 123-211 (or 422) tie line so that grains of the 211 phase (or grains of the 422 phase) are dispersed in the 123 phase, thereby functioning as a magnetic flux pinning center to improve the critical current density (Jc).

The magnetic flux pinning center should be as fine as possible.

In this case, a trace amount of Pt or $CeO_2$ is generally added to the starting composition to micronize grains of the 211 phase (or grains of the 422 phase) formed in the 123 superconductive phase.

However, even when the dispersed phase is micronized by a trace addition of Pt or $CeO_2$, grains of the 211 phase (or grains of 422 phase) formed in the RE 123 phase are micronized at most to an extent of micron order in the RE 123-type oxide superconductors, except Y, which causes a problem, although grains of the 211 phase formed in the Y 123 phase are micronized to an extent of submicron order to exhibit preferable critical current density in the Y 123-type oxide superconductor.

After all, in order to impart "higher critical current density in a lower magnetic field" of a level of the Y 123-type oxide superconductor to the RE 123-type oxide superconductors, except Y, it is considered that grains of the RE 211 phase (or grains of the 422 phase) formed and dispersed in the RE 123 phase should be further micronized.

SUMMARY OF THE INVENTION

Accordingly, it is an object of the present invention to provide a method for preparing stable, even in an air atmosphere, RE 123-type oxide superconductors in which the quantity of mutual replacement between RE and Ba is extremely reduced to exhibit a critical temperature of 90 K or above and grains of a RE 211 phase (or grains of a RE 422 phase) dispersed in a RE 123 phase are further micronized to exhibit a higher critical current density in a magnetic field.

There has been found the following fact as a result of the inventors' eager investigation to achieve the above mentioned object.

(a) Superconductive properties of RE 123-type oxide superconductors vary with the quantity of replacement between RE atoms and Ba atoms, and these superconductors exhibit a higher critical temperature as a composition thereof comes closer to the 123 ratio of the RE phase. However, when a starting composition is molten, cooled and solidified in the atmosphere to grow crystals of the RE 123 phase, it is difficult to control the quantity of replacement between RE atoms and Ba atoms at a lower level and it is impossible to yield a higher critical temperature stably, if the "initial constitution of the starting composition" is adjusted to a composition given on a tie line 123-211 (or 422) from a conventional standpoint of mass balance.

According to a conventional way of thinking, the initial constitution of the starting composition is determined by considering a mass balance so as not to leave unreacted Cu, Ba etc., because they would cause deterioration of the superconductive properties. However, when the initial constitution of the starting composition is changed, the unreacted Cu, Ba, etc. are not left in a superconductive phase to adversely affect the superconductive properties. This would probably be caused by a phenomenon in which excessive Cu, Ba, etc. are expelled from the crystals of the superconductive phase (crystals of RE 123 phase) around thereof and taken out of a system as the crystals grow. Furthermore, it is possible to appropriately control the quantity of replacement between RE and Ba in "RE 123-type oxide crystals to be formed" by changing the initial constitution of the starting composition. Applying this procedure, it is possible to extremely approximate the composition of "RE 123-type oxide crystals to be formed" to that of the RE 123 phase, even in the atmosphere, which allows the production of "RE 123-type oxide superconductors exhibiting a critical temperature of 90 K or above" in an air atmosphere.

(b) Especially, when the initial constitution of the starting composition for preparing the RE 123-type oxide superconductors is shifted to a more Ba-rich side which shows a liquid phase in equilibrium in the atmosphere with a superconductive phase having a composition approximated to the RE 123 phase, i.e., a more Ba-rich side than a composition on the 123-211 (or 422) tie line, it is possible to prepare RE 123-type oxide superconductors of extremely high critical temperatures, in which the quantity of replacement between RE and Ba is controlled to quite a low level, even by a melt-solidifying treatment in the atmosphere.

(c) Further, when the initial constitution of the starting composition is changed, particularly when the constituent is shifted to a more Ba-rich side than a composition on the 123-211 (or 422) tie line, excessive growth of the "grains of the RE 211 phase (or grains of the RE 422 phase) to be formed" is controlled, thereby yielding superconductors in which the grains of RE 211 phase (or grains of the RE 422 phase), still finer than those grains prepared by using conventional initial constitution on the 123-211 (or 422) tie line, are dispersed in the RE 123 phase and the critical current density thereof in a magnetic field is remarkably improved.

When a slight amount of Pt or $CeO_2$ is simultaneously used as a conventional micro-dispersing agent in the above mentioned case, a micronizing effect of the grains of the RE 211 phase (or grains of the RE 422 phase) is remarkably increased to a submicron order, thereby further improving the critical current density thereof in a magnetic field.

The present invention is based on the above mentioned fact and provides a method for preparing RE 123-type oxide superconductors as in the following.

1. A method for preparing rare earth element (RE) 123-type oxide superconductors exhibiting critical temperature of 90 K or above in the air atmosphere by melting, cooling and solidifying a starting composition containing one or more than two kinds of RE, and Ba, Cu and O as constituent elements to crystallize the RE 123-type oxide superconductors, which comprises a step of controlling the quantity of replacement between RE and Ba in "RE 123 crystals to be formed" by changing the initial constitution of said starting composition.

2. A method for preparing RE 123-type oxide superconductors exhibiting a critical temperature of 90 K or above in the air atmosphere described in the above item 1 in which the control of replacement between RE and Ba by changing the initial constitution of the starting composition is conducted by a procedure wherein a RE:Ba:Cu mole ratio of "RE 123 crystals to be formed" is approximated to 1:2:3 as close as possible by changing the initial constitution of the starting composition to a more Ba-rich side than a composition on a "123-211 (or 422) tie line of a REO—BaO—CuO ternary phase diagram", so that grains of a RE 211 phase or grains of a RE 422 phase dispersed in a RE 123 phase are micronized to secure a high critical current density in a magnetic field.

3. A method for preparing RE 123-type oxide superconductors exhibiting a critical temperature of 90 K or above in the air atmosphere described in the above item 1 or 2 in which a slight amount of Pt or $CeO_2$ is added to a starting composition as a micro-dispersing agent for grains of a RE 211 phase or grains of a RE 422 phase.

4. A method for preparing RE 123-type oxide superconductors exhibiting a critical temperature of 90 K or above in the atmosphere described in any one of the above items 1 to 3 in which a means to melt, cool and solidify the starting composition so as to crystallize thereof is a "melt-solidifying process".

5. A method for preparing RE 123-type oxide superconductors exhibiting critical temperature of 90 K or above in the air atmosphere described in any one of the above items 1 to 4 in which RE is Sm.

6. A method for preparing RE 123-type oxide superconductors exhibiting critical temperature of 90 K or above in the atmosphere described in any one of the above items 1 to 4 in which RE is Nd.

In the RE 123-type oxide superconductors of the present invention, RE may include one or more than two kinds of Sm, Nd, La, Pm, Eu, Gd, Y, etc.

A "method for crystallizing RE 123-type oxide superconductors by melting, cooling and solidifying a starting composition to crystallize thereof" used in the present invention may either be a "flux process" or a "melt-solidifying process" in which a starting composition is heated to peritectic temperature or above to bring about a mixed state of solid-liquid and then cooled slowly to cause a peritectic reaction, while it is preferable to use the melt-solidifying process in which a process control is comparably easy and stable products can be obtained smoothly.

It should be understood that, after the starting composition is molten, cooled and solidified to crystallize thereof according to the prevent invention, the thus formed oxide crystals are conventionally subjected to an annealing (heat treating) step in an oxygen atmosphere to secure desired superconductive properties.

As has been described above, it is the most characteristic feature of the present invention to control the quantity of replacement between RE and Ba in "RE 123 crystals to be formed" by changing the initial constitution of the starting composition when the starting composition is molten, cooled and solidified to form RE 123-type oxide superconductors.

In general, although the constitution of a simple composition changes if the proportion of each component contained therein is changed as a matter of course, it is a novel fact that no one ever reported the control of the quantity of replacement between RE and Ba in "RE 123 crystals to be formed" without adversely affecting superconductive properties by simply changing the initial constitution of the starting composition to a slight extent.

According to the above mentioned fact, it is possible to satisfactorily conduct a quantity control of mutual replacement between RE and Ba in the RE 123 phase, even when RE 123-type oxide superconductors are prepared in an air atmosphere, and it is thus possible to grow RE 123-type oxide crystals having a composition approximated to that of the RE 123 phase as close as possible in the low oxygen pressure atmosphere.

Superconductive properties of the RE 123-type oxide superconductors are changed by the quantity of mutual replacement between a RE atom and a Ba atom, and the closer the composition is approximated to RE 123, i.e., RE (such as Sm, Nd, Y, etc.) $Ba_2Cu_3O_7$, the higher the critical temperature is exhibited.

Accordingly, the RE 123-type oxide superconductors exhibiting a critical temperature of 90 K or above can be yielded actually when the quantity of mutual replacement between RE and Ba in the "RE 123 phase to be formed" is reduced so that a composition thereof is approximated to that of RE 123 by changing the initial constitution of the starting composition.

Further, while this quantity control of mutual replacement between RE and Ba by changing the initial constitution of the starting composition is sufficiently applied to the melt-solidifying process which is conducted in the atmosphere, it is possible to prepare the RE 123-type oxide superconductors exhibiting higher critical temperature quite easily at low cost.

In order to reduce the quantity of mutual replacement (solid solubility) between RE and Ba in the RE 123 phase of RE 123-type oxide superconductors, it is effective to change the initial constitution of starting composition to a more Ba-rich side than a composition on the 123-211 (or 422) tie line as will be apparently described in the following embodiment. That is, the quantity of replacement between RE and Ba in the RE 123 phase is increased or decreased depending on an "extent to be changed to the Ba-rich side".

On the other hand, while the surface energy in the liquid phase of molten starting material changes with a change in the initial constitution of the starting composition, it is also possible to control the growth of grains of the RE 211 phase (or grains of the RE 422 phase) dispersed in the RE 123 phase.

For example, when the initial constitution of the starting composition is changed to a more Ba-rich side on the 123-211 (or 422) tie line to reduce the quantity of replacement between RE and Ba in the "RE 123 phase to be formed", an excessive increase in grain size in the RE 211 phase or the RE 422 phase is controlled in cases where RE is Sm, etc. and Nd, etc., respectively, thereby greatly contributing to micronize the grains of the RE 211 phase (or grains of RE 422 phase) dispersed in the RE 123 phase.

While the thus micronized grains of the RE 211 phase (or grains of the RE 422 phase) dispersed in the RE 123 phase allow the improvement of the critical current density in a magnetic field of the RE 123-type oxide superconductors, control of the initial constitution of the starting composition causes the imparting of a higher critical current density in a magnetic field to the superconductors.

As a matter of course, a combined use of "Pt or $CeO_2$ addition in a trace amount" as a conventional means to micronize the grains of the RE 211 phase (or grains of the RE 422 phase) tends to further promote such a micronizing effect, which preferably results in an improvement of the critical current density in a magnetic field.

As has been described above, the RE 123-type oxide superconductors of improved superconductive properties which exhibit a critical temperature of 90 K or above and a higher critical current density in a magnetic field can be stably prepared in the atmosphere by the present invention, which results in extremely useful effects from the stand point of industry.

DESCRIPTION OF THE PREFERRED EMBODIMENT

The present invention will be described in detail together with the effects thereof in the following embodiment.

Using powder of respective $Sm_2O_3$, $BaCO_3$, CuO and a trace amount of Pt as starting materials, Sm 123 superconductors were prepared in the atmosphere by way of trial according to a "seeding process by the use of a Nd 123 seed crystal" as in the following. The starting material is sintered to form a sintered body, which is put on a magnesia single crystal plate and then heated to peritectic temperature or above with Nd 123 seed crystal placed thereon to cause a mixed state of solid and liquid phases, followed by isothermal retention thereof by subcooling from such a state so that a peritectic reaction is induced to form oxide superconductive crystals.

The initial constitution of the starting material was changed variously as shown in Table 1 below.

TABLE 1

| type of starting | proportion of cationic Sm, Ba and Cu | | | Pt content |
|---|---|---|---|---|
| material | Sm | Ba | Cu | (wt. %) |
| A | 0.2368 | 0.3158 | 0.4474 | 0.5 |
| B | 0.2348 | 0.3230 | 0.4422 | 0.5 |
| C | 0.2327 | 0.3302 | 0.4371 | 0.5 |
| D | 0.2286 | 0.3446 | 0.4268 | 0.5 |

Figure 3:
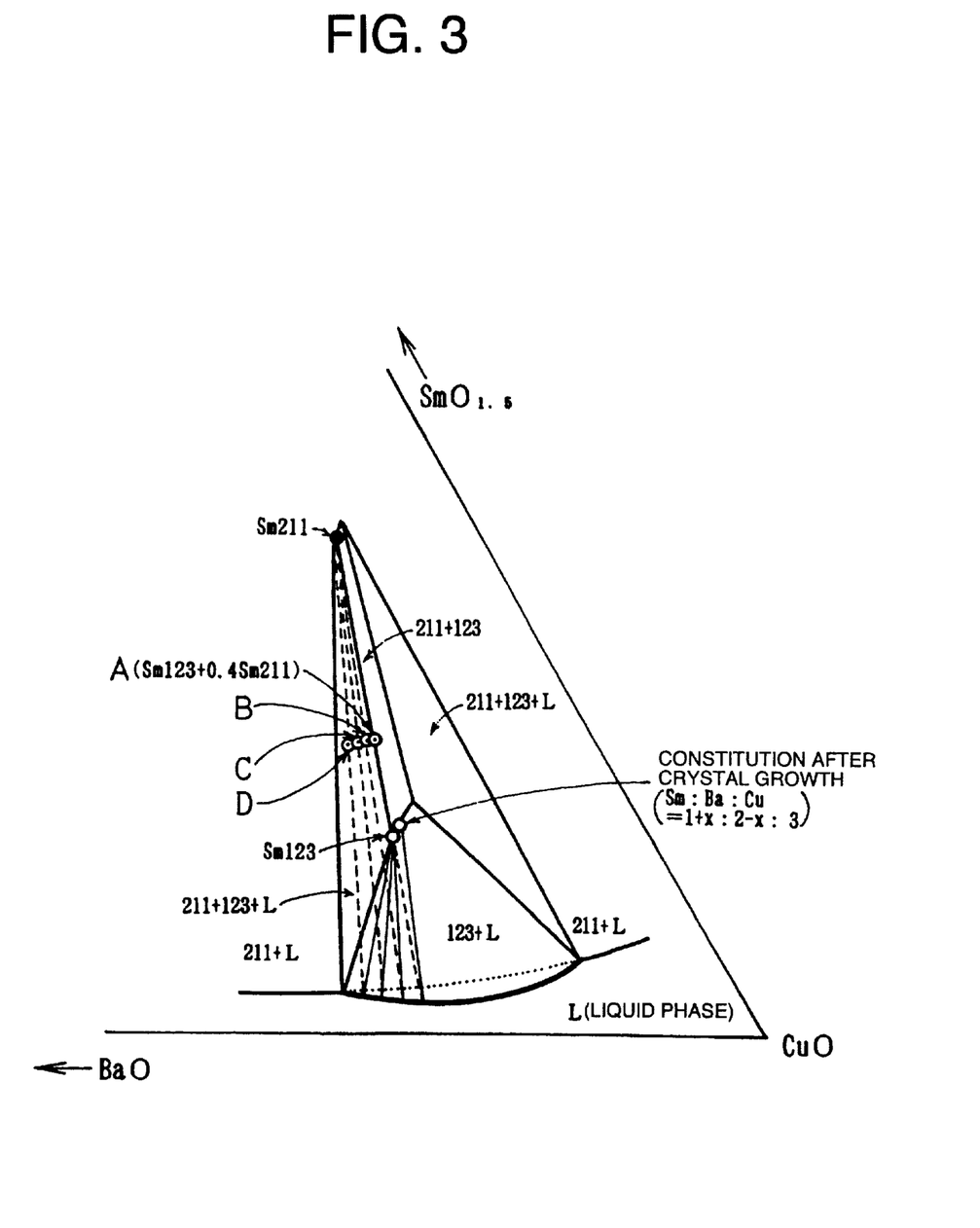
FIG. 3 is a model diagram in main part showing the relationship between an initial constitution used in the present embodiment and a Sm 123 composition thereof after crystal growth on a ternary phase diagram of ½SmO—BaO—CuO.

The initial constitution mentioned in Table 1 is based on a standard composition of "Sm 123+0.4 Sm 211+0.5 wt. % Pt" (type A) on a 123-211 tie line of a ternary phase diagram of ½SmO—BaO—CuO (in main part) shown in FIG. 3, and that of other types (B, C and D) is slightly slid to a more Ba-rich side to keep the quantity of 123-211 constant.

Specimens of each Sm 123 superconductor thus prepared were observed metallographically, while the superconductive properties thereof were evaluated after being subjected to a heat treatment in an oxygen flow at 340° C. for 200 hours by a conventional manner.

Figure 4:
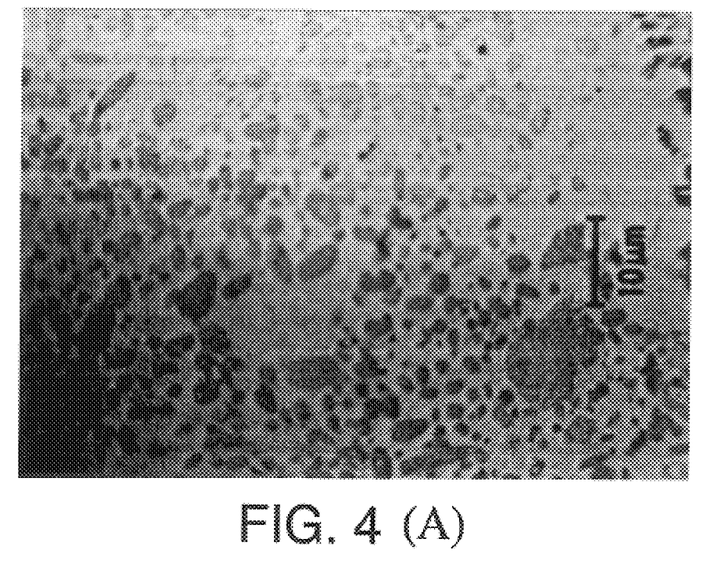
FIG. 4 is electron micrographs showing "grains of the 211 phase dispersed in the 123 phase" of each SM 123 superconductor specimen used for a metallographical observation.

FIG. 4 is electron micrographs showing "grains of the 211 phase dispersed in the 123 phase" of each Sm 123 superconductor specimen used for a metallographical observation, wherein symbols A to D correspond to the initial constitution mentioned in Table 1.

In FIG. 4, black parts show grains of the 211 phase captured by the 123 phase and gray parts show 123 phase matrixes, from which it is possible to confirm that the grain size of the 211 phase decreases as the initial constitution changes from A to D. Especially in the case of the initial constitution D, it is considered that an average grain size of grains of the 211 phase is a submicron order, i.e., these grains are micronized to an approximately similar level as a grain size of "dispersed grains of a Y 211 phase in a Y 123 phase of Y type oxide superconductors" yielded by a conventional process in which a preeminently micronized dispersing phase can be obtained.

Figure 5:
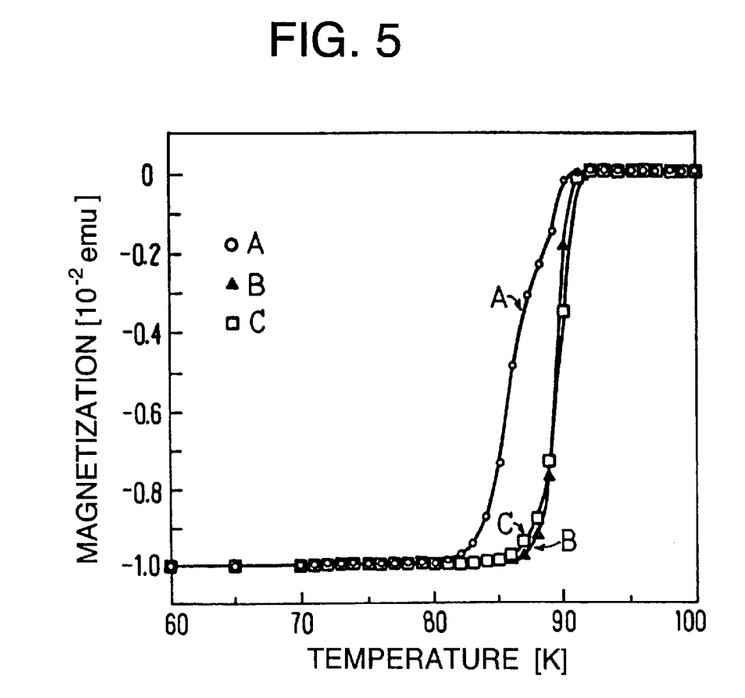
FIG. 5 is a graph showing the relationship between temperature and magnetization of SM 123 superconductor specimens in which the initial constitution is changed.
Figure 6:
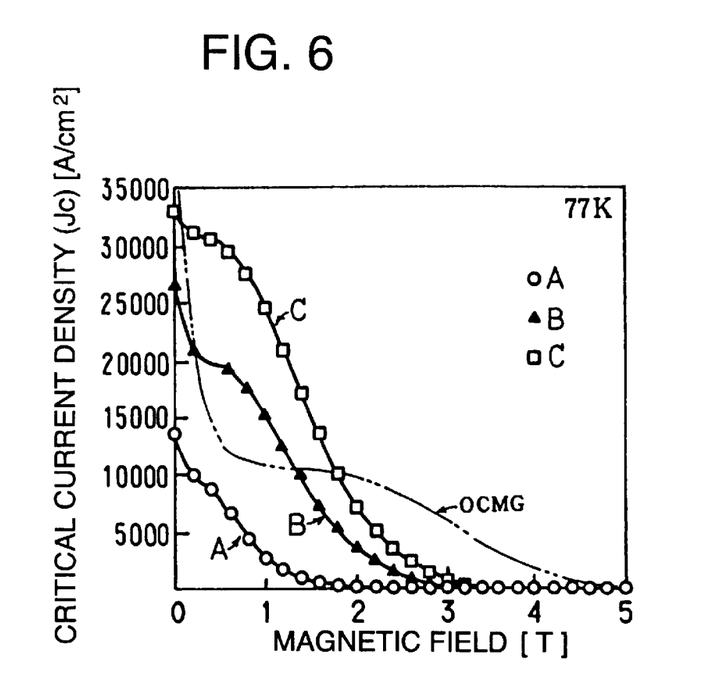
FIG. 6 is a graph showing the relationship between an impressed magnetic field and the critical current density (Jc) of Sm 123 superconductor specimens in which the initial constitution is changed.

FIGS. 5 and 6 are graphs showing test results related to superconductive properties of each Sm 123 superconductor specimen after the heat treatment.

FIG. 5 shows relationship between critical temperature and magnetization of the Sm 123 superconductor specimens which initial constitution has been changed.

It is confirmed from FIG. 5 that the critical temperature of the Sm 123 superconductor having a Ba-rich initial constitution is 93 K, which is a greatly outstanding value compared with that of a "conventional specimen prepared in the atmosphere by starting from an initial constitution on the 123-211 tie line".

The relationship between an "extent of change in the initial constitution of starting composition" and "quantity x of replacement between Sm and Ba in a Sm 123 superconductor of $Sm_{1+x}Ba_{2-x}Cu_3O_y$ to be formed" was calculated back from data showing the relationship between known "quantity of replacement x and critical temperature Tc". As a result, it was found that the quantity x of replacement is 0.02 (Tc=92 K), 0.01 (Tc=93 K) and slightly less than 0.01 in Sm 123 superconductors prepared by using the initial constitution, A, B and C, respectively. Accordingly, it was confirmed that the quantity x of replacement between Sm and Ba in "Sm 123 superconductive crystals to be formed" can be controlled by adjusting the initial constitution of the starting composition.

FIG. 6 shows the relationship between an impressed magnetic field and critical current density (Jc) of Sm 123 superconductor specimens which initial constitution has been changed.

It is apparent from FIG. 6 that the Sm 123 superconductor exhibits greatly outstanding properties at a side of lower magnetic field (in the vicinity of 1 T) compared with a product prepared by the OCMG process. This would be caused by an "improvement in the critical temperature (Tc) due to the control of Sm replacement at a Ba site" and an "improvement in the flux pinning effect due to micronized grains of the Sm 211 phase".

In general, the measurement of the atomic abundance ratio by means of EPMA is used to determine the quantity x of replacement between RE and Ba in RE oxide superconductors of $RE_{1+x}Ba_{2-x}Cu_3O_y$.

The atomic abundance ratio of each SM 123 superconductor specimen formed in the present embodiment was determined by means of EPMA, and it was confirmed that the quantity x of replacement is vague even in the case of the initial constitution A wherein the value x is considered as the highest, and that the value x in the Sm 123 phase falls almost within a measurement error range.

Although production of Sm 123 superconductors has been described in the present embodiment, it was also ascertained that a similar result can be obtained in the case of Nd 123 superconductors.

Further, it was confirmed that the method of the present invention can be effectively applied to prepare RE 123-type oxide superconductors in which RE other than Sm and Nd, such as Y, La, Pm, Bu, Gd, etc. is used.

What is claimed is:

1. A method for preparing RE oxide superconductors exhibiting a critical temperature of at least 90° K comprising the steps of forming a starting composition containing a mixture of at least one RE, and Ba, Cu and O, the Ba content being richer than compositions on a 123-211 or 123-422 tie-line of a REO—BaO— CuO ternary phase diagram, melting, cooling and solidifying the starting composition to crystallize a RE oxide superconductor having micronized grains of a RE 211 phase or grains of a RE 422 phase dispersed in a RE 123 phase, where RE is a rare earth element, wherein said melting, cooling and solidifying steps are conducted in an air atmosphere.

2. The method of claim 1, additionally comprising the step of adding Pt or $CeO_2$ to the mixture.

3. The method of claim 1, wherein RE is Sm.

4. The method of claim 1, wherein RE is Nd.

5. The method of claim 2, wherein RE is Sm.

6. The method of claim 2, wherein RE is Nd.

* * * * *